United States Patent
Casinelli et al.

[19]

[11] Patent Number: 6,104,608
[45] Date of Patent: *Aug. 15, 2000

[54] NOISE REDUCTION HOOD FOR AN ELECTRONIC SYSTEM ENCLOSURE

[75] Inventors: Arthur P. Casinelli, Medway; Michael T. Gorman, Upton, both of Mass.

[73] Assignee: EMC Corporation, Hopkinton, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/961,292

[22] Filed: Oct. 30, 1997

[51] Int. Cl.⁷ .................................................. E04F 17/04
[52] U.S. Cl. ........................ 361/692; 181/224; 454/184
[58] Field of Search .................... 415/119, 197, 415/206; 417/312; 454/184; 165/80.3, 122–126, 96, 99; 181/224, 225, 229, 252, 255, 258, 268, 286, 288, 290, 292; 361/687, 688, 690, 692, 694, 695, 696, 697, 724

[56] References Cited

U.S. PATENT DOCUMENTS

| | | | |
|---|---|---|---|
| 2,950,776 | 8/1960 | Stephens | 181/42 |
| 3,085,647 | 4/1963 | Jenn et al. | 181/56 |
| 4,235,303 | 11/1980 | Dhoore | 181/214 |
| 4,258,821 | 3/1981 | Wendt et al. | 181/202 |
| 4,508,486 | 4/1985 | Tinker | 415/119 |
| 4,611,531 | 9/1986 | Kucharczyk | 98/39.1 |
| 4,767,262 | 8/1988 | Simon | 415/119 |
| 4,782,913 | 11/1988 | Hoffmann et al. | 181/286 |
| 4,787,473 | 11/1988 | Fuchs et al. | 181/224 |
| 4,810,269 | 3/1989 | Stackhouse . | |
| 4,827,733 | 5/1989 | Dinh . | |
| 4,900,344 | 2/1990 | Lansing . | |
| 4,985,804 | 1/1991 | Campbell | 361/695 |
| 5,056,331 | 10/1991 | Lotz | 62/237 |
| 5,101,321 | 3/1992 | Remise et al. | 361/384 |
| 5,199,846 | 4/1993 | Fukasaku et al. | 415/119 |
| 5,332,872 | 7/1994 | Ewanek | 181/224 |
| 5,526,228 | 6/1996 | Dixkson et al. | 361/695 |
| 5,532,439 | 7/1996 | Minkin | 181/224 |
| 5,638,259 | 6/1997 | McCarthy | 361/695 |
| 5,650,912 | 7/1997 | Katsui | 361/687 |
| 5,793,608 | 8/1998 | Winick | 361/695 |

OTHER PUBLICATIONS

IBM Technical Disclosure Bulletin, R. C. Chu, "Air–Cooling Scheme Having Enchanced Acoustic Performance", Aug. 1979, pp. 1108–1109, vol. 22, No. 3.

IBM Technical Disclosure Bulletin, D. K. DeSilva, R. M. Dunn and N. Timko, Jr. "Low Noise Air Moving Chamber For An Electronic Apparatus Enclosure", Sep. 1977, vol. 20, No. 4, p. 1336.

*Primary Examiner*—Gerald Tolin
*Attorney, Agent, or Firm*—Wolf, Greenfield & Sacks P.C.

[57] ABSTRACT

A noise reduction hood for attenuating the acoustic noise of cooling fans emanating from an electronic enclosure. The hood is comprised of a base that is constructed and arranged to be supported on the enclosure. The base has an air duct that is adapted to pass air therethrough in a first direction, and includes at least one noise reduction panel disposed in the air duct to attenuate acoustic noise emanating from the enclosure. In one embodiment, the noise reduction panel divides the air duct into a plurality of acoustical flow passages extending through the base. In another embodiment, the hood includes a cover, which may be detachable, that is adapted to divert the air from the first direction to a second direction. In a further embodiment, the hood includes a rim extending from the base for surrounding a portion of the enclosure to secure the hood to the enclosure. The hood may include a plurality of interlocking panels that are arranged in a grid pattern to form an array of acoustical flow passages.

36 Claims, 6 Drawing Sheets

NOISE REDUCTION HOOD FOR AN ELECTRONIC SYSTEM ENCLOSURE

BACKGROUND OF THE INVENTION

1. Field of the Invention

The present invention relates to a noise reduction hood for attenuating the level of acoustic noise emanating from an electronic system enclosure.

2. Description of Related Art

An electronic system, such as a computer system, is conventionally comprised of various electronic components, including peripheral devices such as a disk drive, that are mounted and electrically interconnected within an electronic cabinet or enclosure. Electronic components generally are temperature sensitive devices that, if allowed to overheat, are likely to malfunction or become permanently damaged. Since electronic systems can dissipate a large amount of heat, adequate ventilation is critical for removing the heat from the cabinet to avoid creating a high temperature condition that could result in a system failure.

Conventionally, a cabinet is ventilated using one or more fans or blowers to force cooling air through the cabinet so that the temperature of the equipment is maintained within acceptable limits. One problem associated with ventilating electronic cabinets using cooling fans is the emanation of acoustic noise associated with fan operation. Although an individual fan may not produce significant noise levels by itself, electronic cabinets typically utilize multiple fans to produce sufficient air flow through the cabinet. The cumulative affect of multiple fans can produce a level of acoustic noise that poses problems in a work environment. For example, high noise levels can be very distractive and annoying, and can interfere with conversational level speech. This can become even more problematic in office, lab or test area environments where many cabinets of electronic equipment may be operating simultaneously.

A proposed solution to this problem is disclosed in U.S. Pat. No. 5,526,228 to Dickson et al., issued on Jun. 11, 1996. An acoustic dampening shroud is mounted to the rear panel of a computer system enclosure at the cabinet exhaust. The shroud includes acoustic noise reduction lining and a ventilation aperture disposed at the bottom of the shroud, away from the cooling fans, to minimize the amount of noise emanating from the computer system.

Other solutions have been proposed including the use of internal acoustic walls to deflect or absorb noise, or locating the cooling fans toward the center of the cabinet away from the inlet and exhaust apertures.

It is an object of the present invention to provide an improved method and apparatus for reducing the acoustic noise level emanating from an electronic system cabinet.

SUMMARY

In one illustrative embodiment of the invention, a noise reduction hood is provided for an electronic system enclosure. The hood comprises a base that is constructed and arranged to be supported on the enclosure, and at least one noise reduction panel mounted on the base. The base has an air duct that is adapted to pass air therethrough in a first direction. The at least one noise reduction panel extends across the air duct to form a plurality of acoustical flow passages extending through the base along axes that are parallel to the first direction. The air is to be passed through the acoustical flow passages to attenuate acoustic noise emanating from the enclosure.

In another illustrative embodiment of the invention, the hood comprises a base that is constructed and arranged to be supported on the enclosure, and a cover supported on the base. The base has an air duct that is adapted to pass air therethrough in a first direction. The base includes at least one noise reduction panel disposed in the air duct to attenuate acoustic noise emanating from the enclosure. The cover diverts the air from the first direction to a second direction.

In a further illustrative embodiment of the invention, the hood comprises a base having an air duct that is adapted to pass air therethrough in a first direction, and a rim extending from the base approximately parallel to the first direction. The base includes at least one noise reduction panel disposed in the air duct to attenuate acoustic noise emanating from the enclosure. The rim is constructed and arranged to surround a portion of the enclosure to secure the base to the enclosure.

BRIEF DESCRIPTION OF THE DRAWINGS

The foregoing and other objects and advantages of the present invention will become apparent with reference to the following detailed description when taken in conjunction with the accompanying drawings in which.

DETAILED DESCRIPTION OF ILLUSTRATIVE EMBODIMENTS

Figure 1:
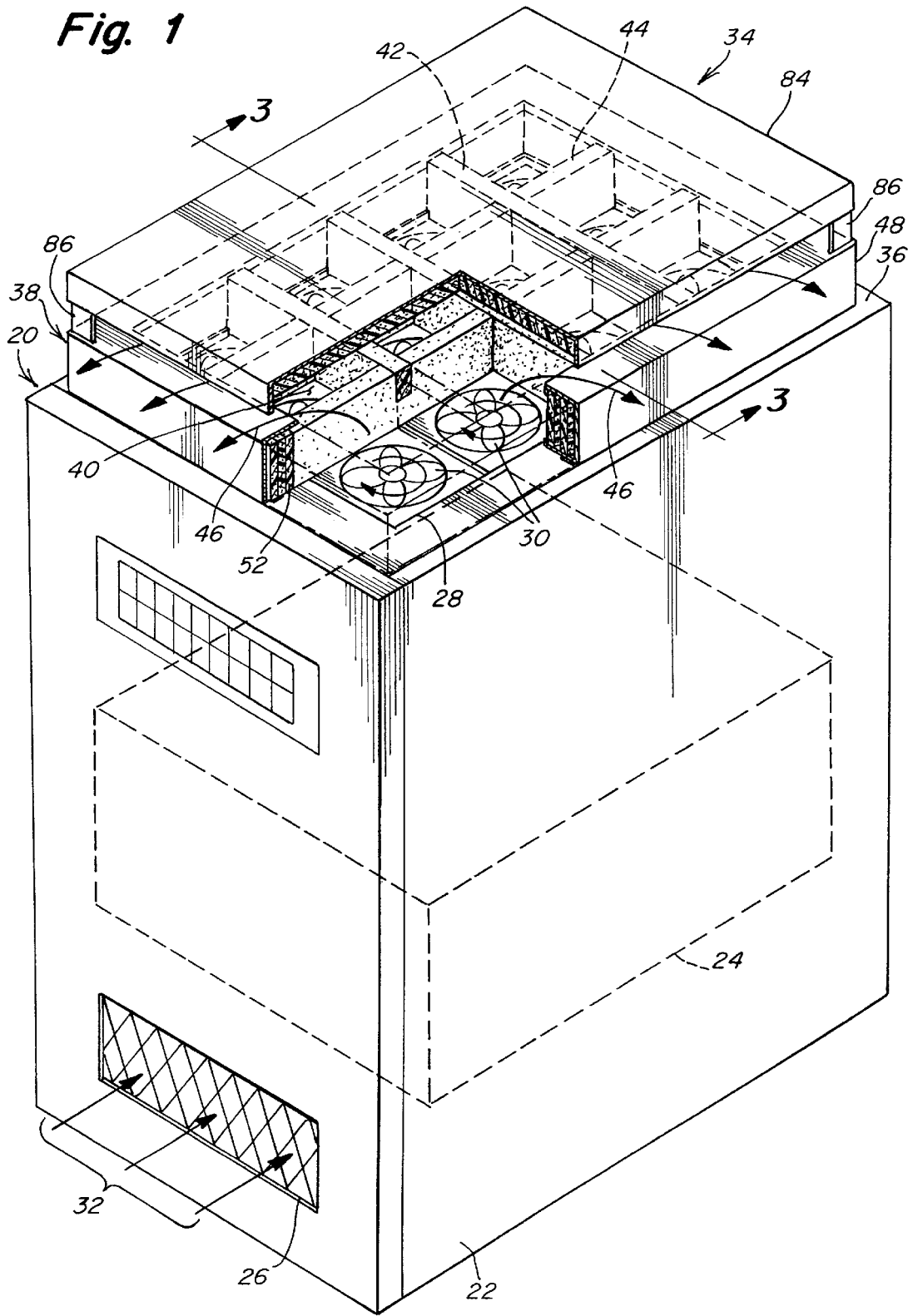
FIG. 1 is a partially fragmented perspective view of an electronic system incorporating a noise reduction hood according to one illustrative embodiment of the present invention.
Figure 2:
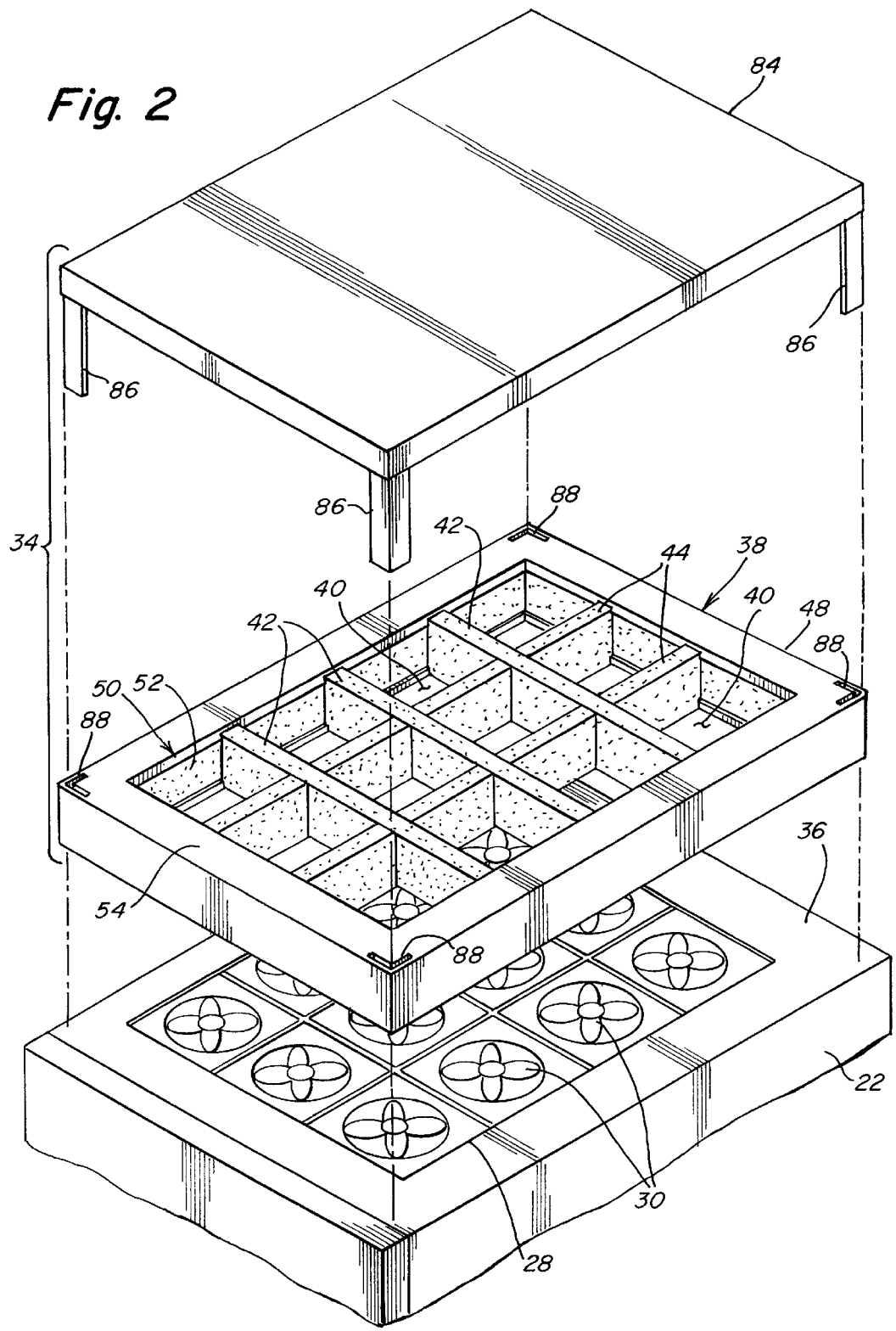
FIG. 2 is an exploded perspective view of the noise reduction hood of FIG. 1.

In accordance with one illustrative embodiment of the invention, a noise reduction hood is provided for an electronic system, such as a computer system. The hood is supported on the top panel of the system enclosure to reduce the acoustic noise level emanating from the air exhaust due to the operation of cooling fans which draw cooling air through the enclosure. The hood has minimal impact on the amount of air flowing through the enclosure, and it can be adapted to be compatible with any enclosure configuration. It should be appreciated that the illustrative embodiments discussed below, in which like reference characters designate like features, are provided merely for illustrative purposes, and that numerous other implementations are possible.

An illustrative electronic system is shown in FIG. 1. The electronic system 20 includes an enclosure or cabinet 22 that houses the electronic components 24 of the system. The enclosure 22 includes an air inlet 26 at the lower portion of its front panel and an air outlet 28 at its top panel. Cooling fans 30 are mounted in the enclosure at the air outlet 28 and are operated to draw cooling air 32 through the enclosure 22 via the air inlet 26 to cool the system components 24. As the air passes through the enclosure 22, it carries the heat dissipated by the electronics 24 out of the enclosure through the air outlet 28. It is to be understood that the locations of the air inlet and air outlet can be varied to suit the specific needs of the system.

In one illustrative embodiment of the invention shown in FIGS. 1–4, the noise reduction hood 34 is supported on the top panel 36 of the enclosure to attenuate the cooling fan acoustic noise with minimal reduction in the amount of cooling air passing through the enclosure. As discussed above, the hood 34 of the present invention is not limited to any particular configuration, and can be employed with enclosures of many other types.

The hood 34 includes a base 38 that has a plurality of flow passages 40 defined by a plurality of noise reduction panels 42, 44. The hood 34 surrounds the air outlet 28 to ensure that the exhaust air 46 passes through the flow passages 40 so that the panels 42, 44 absorb a portion of the acoustic noise emanating from the air outlet 28. The flow passages 40 extend through the base 38 along axes that are parallel with the direction of air flow from the enclosure. This arrangement minimizes the pressure loss through the hood so that the fans 30 deliver a sufficient amount of cooling air through the enclosure.

As illustrated, the panels 42, 44 may be arranged in a grid pattern to form a two-dimensional array of acoustical flow passages 40 corresponding to the particular cooling fan configuration. It is to be understood, however, that the hood is not limited to any particular arrangement of flow passages and that the flow passages need not correspond to the particular fan arrangement.

Figure 3:
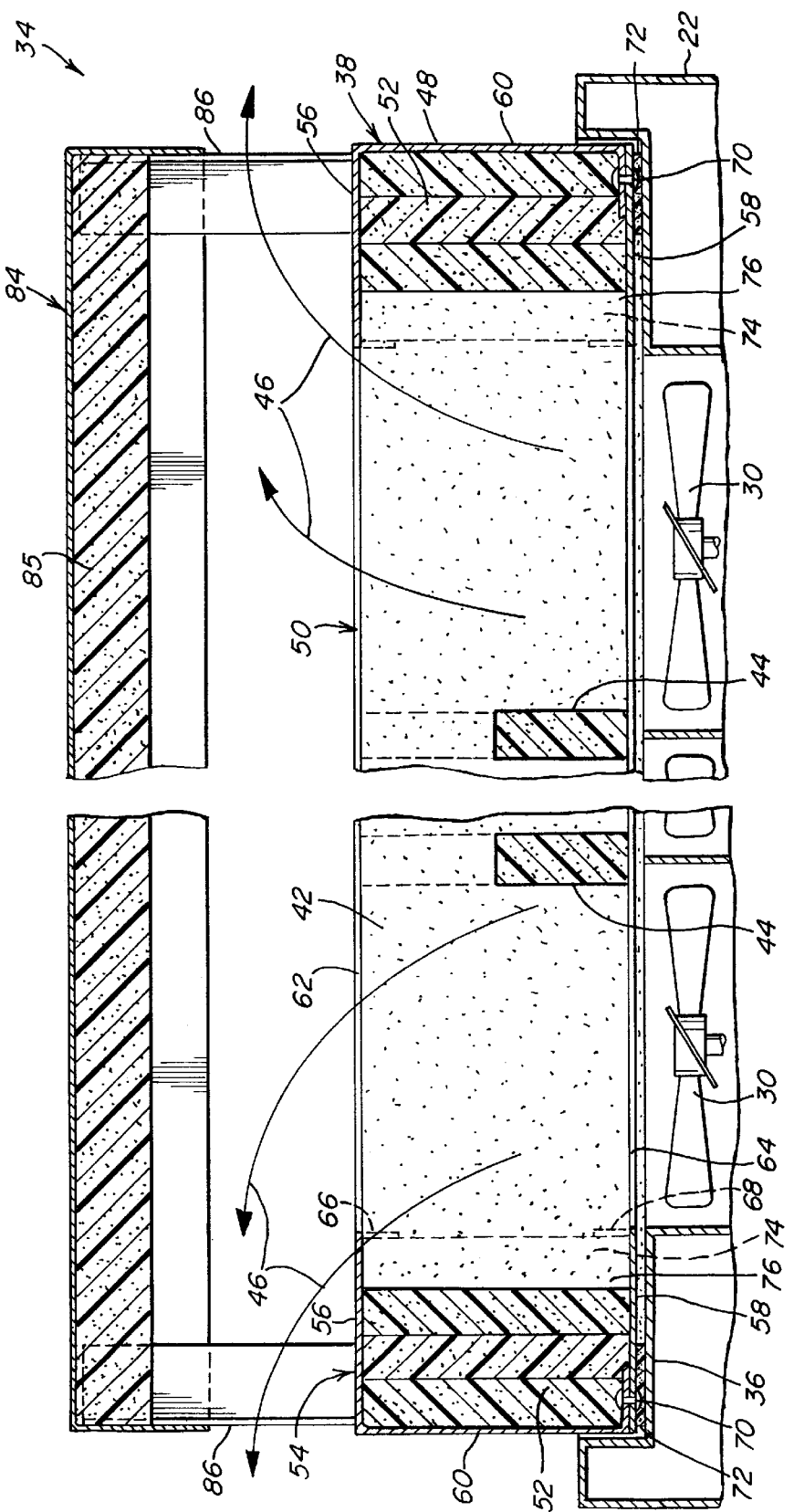
FIG. 3 is a cross-sectional view of the noise reduction hood of FIG. 1 taken along section line 3—3.
Figure 4:
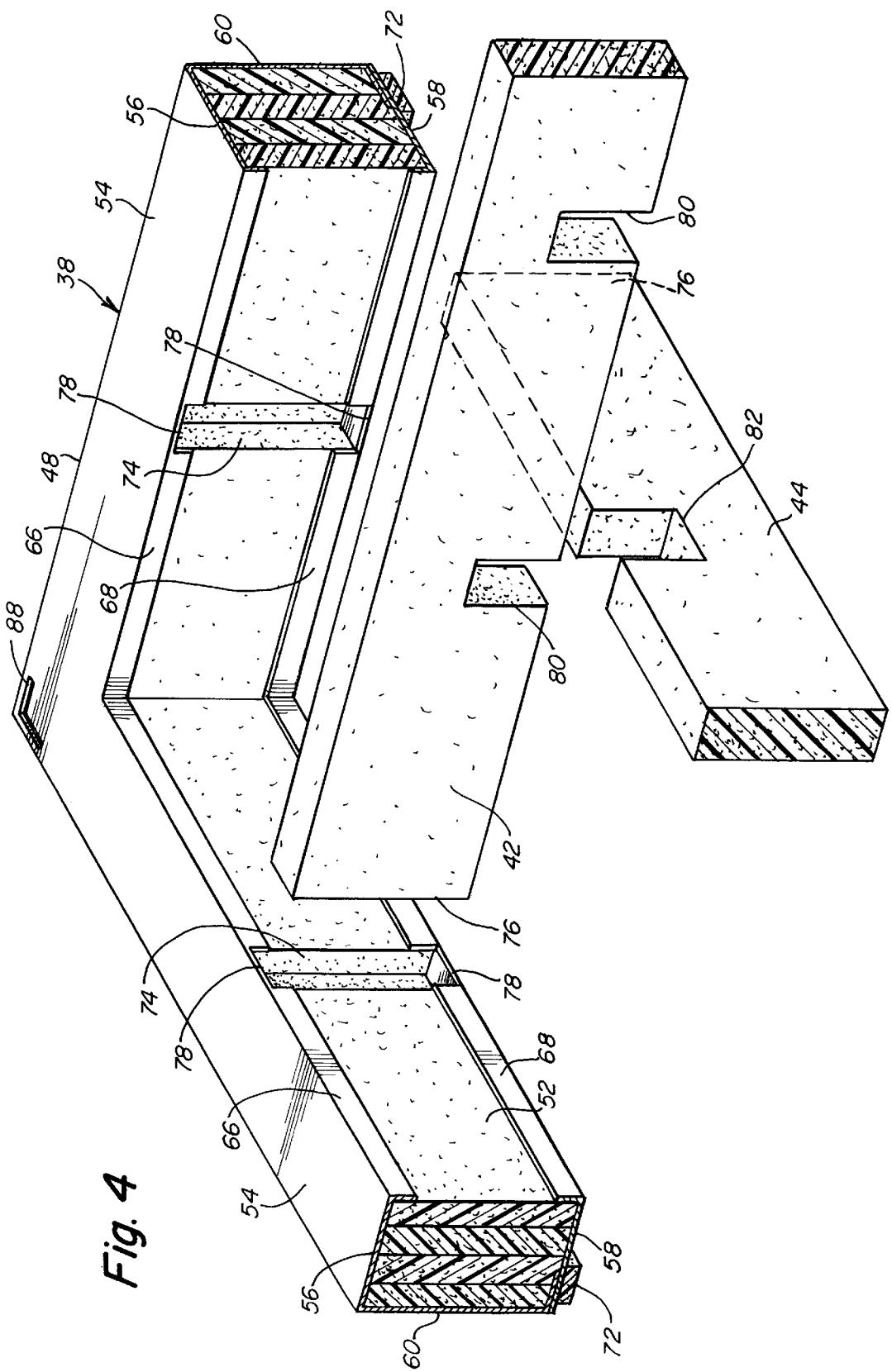
FIG. 4 is a fragmented exploded perspective view of the rear corner of the base of FIG. 2.

The base 38 includes a housing 48 that encloses the air outlet 28 of the enclosure 22 so that the exhaust air 46 is confined to flow through the flow passages 40. The housing 48 has a main air duct 50 that is subdivided into a desired arrangement of flow passages 40 by mounting the acoustical panels 42, 44 in the duct. To further attenuate the acoustic noise level, an acoustical lining 52 for the main air duct 50 is provided in the perimeter 54 of the housing. As illustrated in FIGS. 3 and 4, the acoustical liner 52 is formed from several layers of an acoustical attenuation material, such as an acoustical foam, stacked against each other to substantially fill the housing perimeter 54. The number of panels, of course, may vary depending on the size of the housing perimeter and the thickness of the panels. Alternatively, the housing perimeter 54 may be filled with a uniform block of acoustical attenuation material.

In one illustrative embodiment, the housing 48 includes an upper wall 56, a lower wall 58 and side walls 60 extending between and connecting the upper and lower walls to each other. The upper and lower walls 56, 58 have apertures 62, 64 (FIG. 3) that are aligned to form, along with the acoustical lining 52, the main air duct 50 through the base. To secure the acoustical lining 52 within the perimeter of the housing, the inner edges of the upper and lower walls 56, 58 are angled toward each other to form retention flanges 66, 68.

As shown in FIGS. 3 and 4, the upper wall 56 and side walls 60 may be formed as a unitary structure with the lower wall 58 being secured to the side walls using a fastener 70 (FIG. 3), such as a rivet. It is to be appreciated, however, that the housing 48 may be formed in any suitable manner including, but not limited to, welding, brazing, molding and the like.

The base 38 may also include a perimeter gasket 72 that bears against the top panel 36 of the enclosure about the air outlet 28. The gasket 72, which may be made from any suitable material, ensures that the exhaust air 46 passes through the hood.

As discussed above, the grid of noise reduction panels 42, 44 subdivides the main air duct 50 of the housing into an array of flow passages 40. In one illustrative embodiment, a plurality of pockets 74 is spaced about the inner perimeter of the housing in the acoustical lining 52 surrounding the main air duct 50. The pockets 74 are configured to snugly receive the ends 76 of the noise reduction panels 42, 44 and support the acoustical grid in the main air duct. The upper and lower flanges 66, 68 may include notches 78 to allow the pockets 74 and the panel ends 76 to extend along a substantial portion of the height of the housing.

In one illustrative embodiment, the grid of noise reduction panels 42, 44 is comprised of a first group of the panels 42 that extend across the opening in a first direction and a second group of the panels 44 that extend across the opening in a second direction transverse to the first direction. The ends of each panel are received in opposing pockets 74, as described above. The panels 42, 44 are interconnected using interlocking slots 80, 82 that are spaced along the length of each panel. As shown in FIG. 4, one panel 42 includes downwardly facing slots 80 that mate with upwardly facing slots 82 in the other panel 44 as the panels are pushed together. This arrangement provides a cost effective method for readily assembling grids of various configurations simply by adding or removing one or more panels. It is to be appreciated that the grid may be formed using other techniques including, but not limited to, bonding panels to each other, or molding the grid as a unitary structure.

In the illustrative embodiment shown in FIGS. 1–4, the hood 34 also includes a cover 84 that is mounted to the base 38 for redirecting the exhaust air in an outward lateral direction as the air passes through the base. One or more layers of noise reduction material 85 (FIG. 3) may be attached to the bottom surface of the cover 84 to further reduce the acoustic noise level as the exhaust air impinges and is redirected by the cover. To increase the versatility of the hood for various applications, the cover 48 may be detachable from the base 38. For example, it may be desirable to reduce the overall height of the hood for accommodating a low ceiling or similar height constraint situations. Additionally, it should be understood that some embodiments of the noise reduction hood do not need the cover 48 for the desired noise attenuation.

In one embodiment, the cover 84 includes posts 86 that support the cover on the base above the flow passages 40. The support posts 86 are slidably received in similarly shaped apertures 88 (FIG. 2) on the base to provide a convenient means of attaching and removing the cover to and from the base. As illustrated, the posts 86 may be angled members that mate with similarly angled slots 88. It is to be understood, however, that the particular shape of the support posts can vary and that the cover may utilize other means for being removably attached to the base.

In one embodiment, the acoustical material attenuates frequencies from approximately 500 Hz. The acoustical material used throughout the noise reduction hood may be a urethane foam, such as Tufcote E-100SF polyether urethane foam available from E-A-R Specialty Composites. Additionally, the housing 48 and cover 84 may be made from a metal, such as aluminum. It should be understood, however, that any suitable material may be used for the acoustical panels and lining, the housing and the cover.

Figure 5:
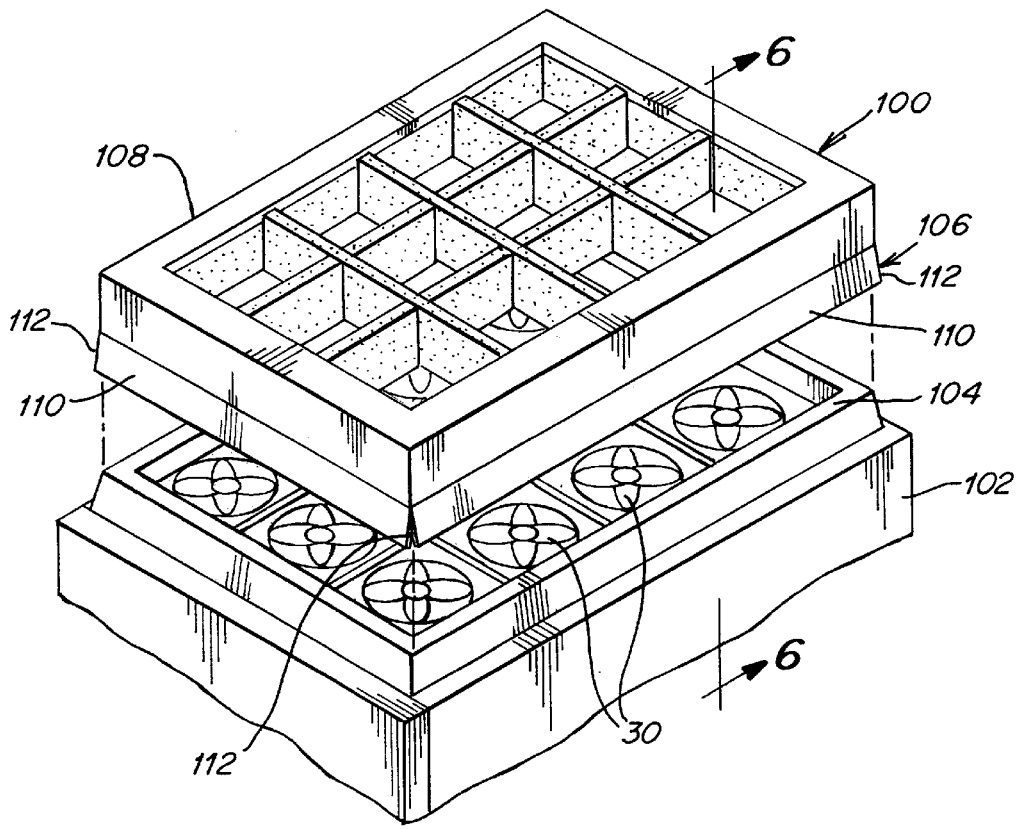
FIG. 5 is a fragmented exploded perspective view of an electronic system incorporating a noise reduction hood according to another illustrative embodiment of the present invention.
Figure 6:
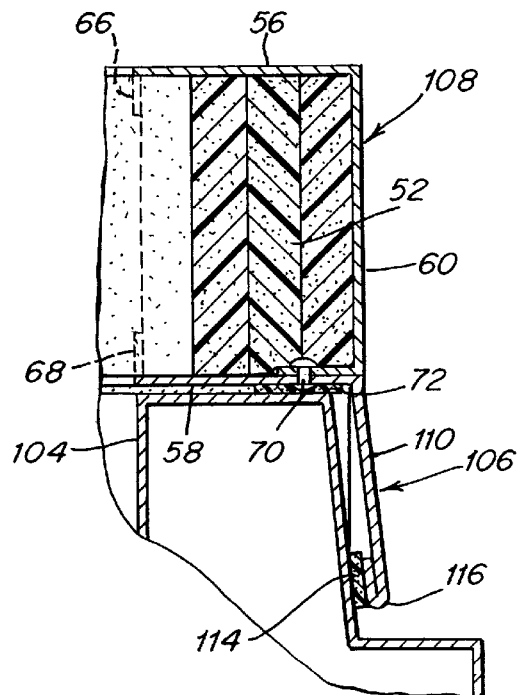
FIG. 6 is a cross-sectional view of the noise reduction hood of FIG. 5 taken along section line 6—6.

In another illustrative embodiment of the invention as shown in FIGS. 5–6, a noise reduction hood 100 is provided for use on an electronic enclosure 102 that includes a raised wall 104 surrounding the perimeter of the air outlet. The hood 100 includes a downwardly depending rim 106 that is pushed down and around the outer perimeter of the wall 104 to secure the hood on the enclosure.

In one illustrative embodiment, the hood 100 is comprised of a base 108, such as the base 38 described above, with the rim 106 being supported on the bottom of the base. The rim 106 includes flexible rim flanges 110 supported along each side of the base that allow the rim to expand and securely grasp the outer surface of the wall 104, particularly when the wall is angled as shown in FIG. 6. To ensure that the rim 106 is flexible, the flanges 110 are not connected to each other at the rim corners 112 so that they may flex independently. A gasket 114 may be provided along the inner wall of each rim flange 110 to enhance the grip of the rim against the wall 104.

In one embodiment, the rim flanges 110 are integral extensions of the bottom wall of the base. Alternatively, the rim 106 may be comprised of individual flanges 110 that are fastened along the outer perimeter of the bottom wall of the base using fasteners, such as rivets, screws and the like, or other fastening techniques, such as welding and the like. The bottom edge 116 of each rim flange may be hemmed to stiffen the rim for a secure fit. It is also contemplated that a cover, such as the cover 84 described above, may be utilized with this hood for additional noise attenuation.

Figure 7:
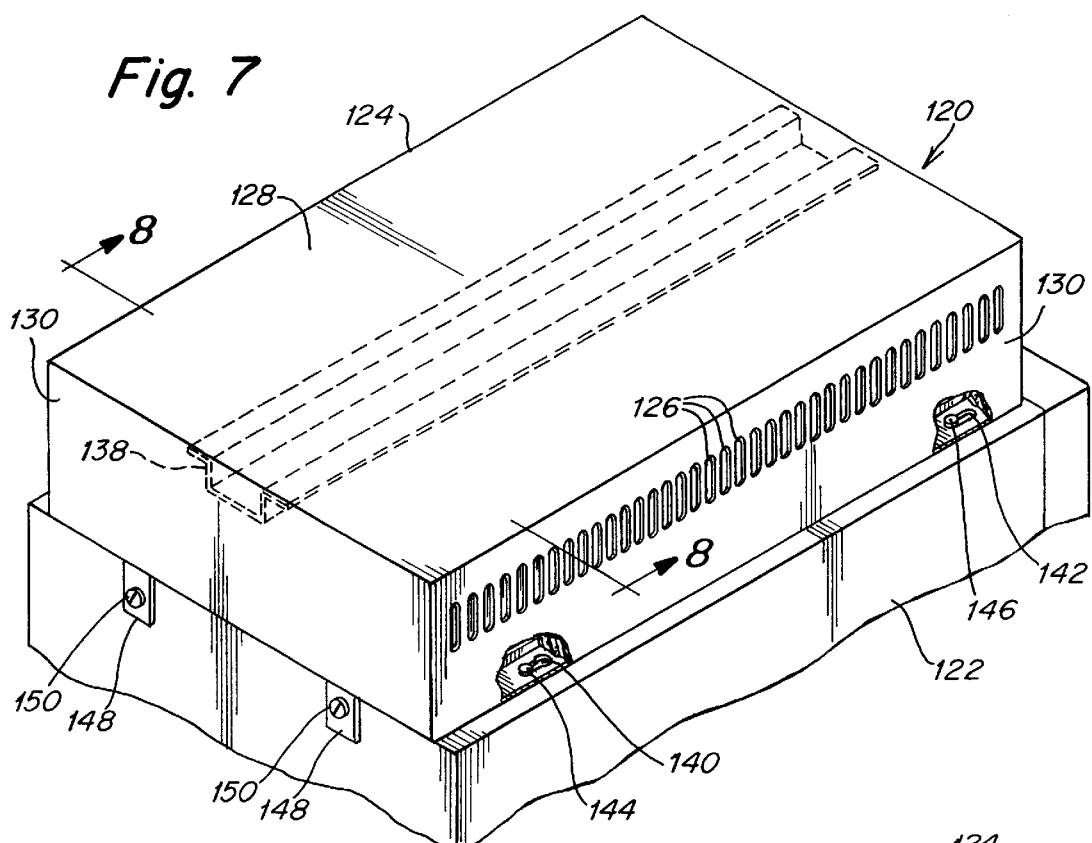
FIG. 7 is a fragmented rear perspective view of an electronic system incorporating a noise reduction hood according to a further illustrative embodiment of the present invention.
Figure 8:
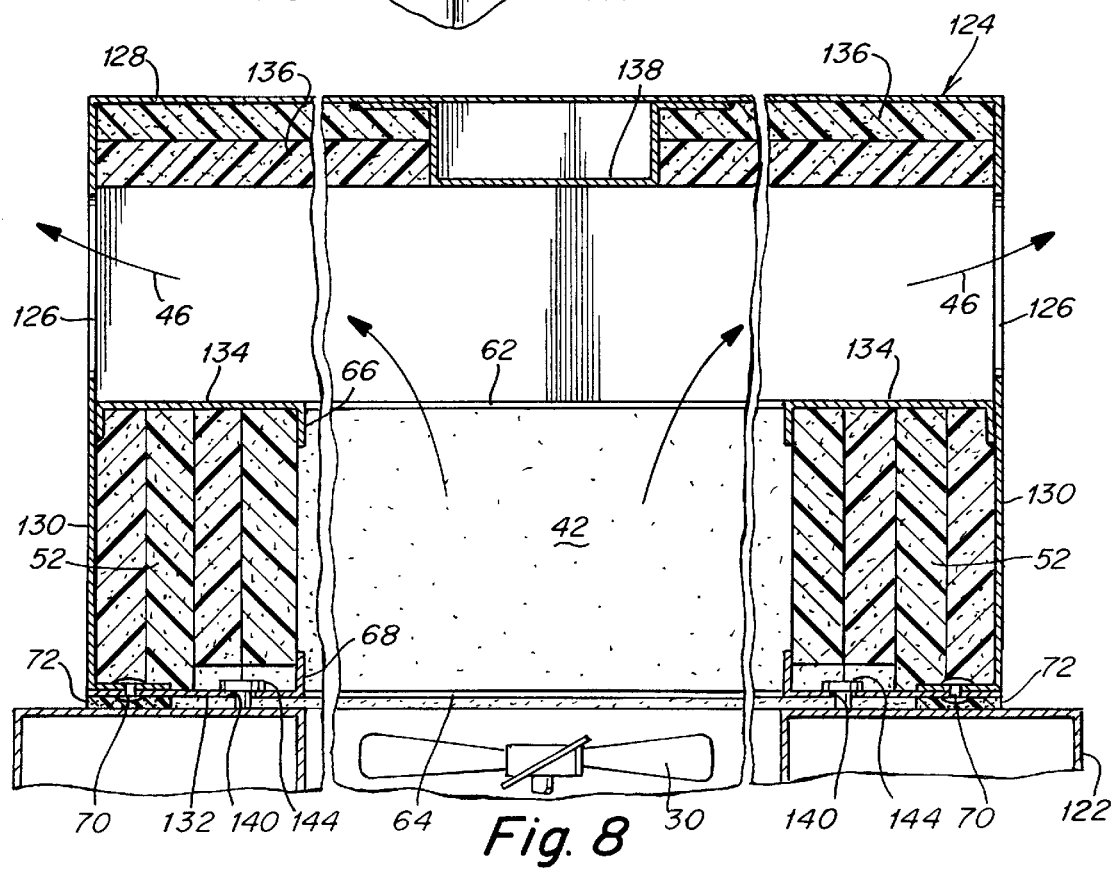
FIG. 8 is a cross-sectional view of the noise reduction hood of FIG. 7 taken along section line 8—8.

In a further embodiment of the invention as shown in FIGS. 7–8, a noise reduction hood 120 is provided for attenuating the acoustical noise emanating from an enclosure 122 of relatively short height. The hood 120 includes a substantially enclosed housing 124 to shield the air outlet at the top of the enclosure. As illustrated, the housing 124 includes a plurality of exhaust apertures 126, such as slots or holes, through which the exhaust air from the enclosure flows.

In one embodiment, the housing 124 includes a top wall 128, side walls 130 and a bottom wall 132 that are interconnected to provide a substantially enclosed housing. An intermediate wall 134 is supported above the bottom wall 132 to form a base portion that supports an acoustical lining 52 and a grid of noise reduction panels 42, 44, as described above, for attenuating the acoustic noise. One or more layers of acoustical panels 136 may be mounted to the lower surface of the top wall, similar to the cover 84 described above, to further reduce the noise level as it redirects the exhaust air through the exhaust apertures.

As illustrated, the top wall 128 of the housing may be reinforced so that it can support additional equipment, such as a personal computer, that may be placed on the hood. In one embodiment, a generally U-shaped channel 138 is attached along the central portion of the top wall 128 with the acoustical panels 136 mounted to the wall on each side of the channel 138. It is to be appreciated that other structures and methods may be used to reinforce the top wall of the hood.

In one illustrative embodiment shown in FIGS. 7–8, the hood 120 may secured to the enclosure to ensure that it does not become inadvertently dislodged. Any number of techniques may be implemented for this purpose. In one embodiment, the hood 120 includes a slide lock 140 and a slide guide 142 that cooperate with corresponding lock and guide posts 144, 146 on the enclosure. As shown, the slide lock 140 may be a keyhole-shaped slot that receives and locks with a T-shaped post 144 to prevent the hood from being lifted from the enclosure. To prevent the slide lock 140 from being inadvertently released, the hood 120 may also include locking tabs 148 which are secured to the enclosure using conventional fasteners 150, such as screws and the like.

Although the noise reduction hood in each of the illustrative embodiments is shown as being rectangular, it is to be appreciated that the particular shape and size of the hood is exemplary, and that other shapes and sizes are contemplated.

Having described several embodiments of the invention in detail, various modifications and improvements will readily occur to those skilled in the art. Such modifications and improvements are intended to be within the spirit and scope of the invention. Accordingly, the foregoing description is by way of example only and is not intended as limiting. The invention is limited only as defined by the following claims and their equivalents.

What is claimed is:

1. A noise reduction hood for an electronic system enclosure, the enclosure having an aperture that is adapted to receive air therethrough, the hood comprising:

a base that is constructed and arranged to be supported on the enclosure, the base including a first end wall with an inlet, a second end wall with an outlet and a side wall connecting the first and second end walls, the base having an air duct that is adapted to pass air therethrough in a first direction substantially perpendicular to the first and second end walls from the inlet to the outlet, the inlet adapted to be positioned adjacent the aperture when the base is supported on the enclosure, the base having a height extending in the first direction, the first end wall being spaced from the second end wall by the height of the base; and at least one noise reduction panel mounted on the base between the first and second end walls, the at least one noise reduction panel extending across the air duct to form a plurality of acoustical flow passages extending through the base along axes that are parallel to the first direction, the at least one noise reduction panel having a length in the first direction that is substantially equal to the height of the base, the air to be passed through the acoustical flow passages to attenuate acoustic noise emanating from the enclosure.

2. The noise reduction hood recited in claim 1, wherein the at least one noise reduction panel includes a grid of noise reduction panels.

3. The noise reduction hood recited in claim 2, wherein the plurality of acoustical flow passages is arranged in a two-dimensional array.

4. The noise reduction hood recited in claim 1, further comprising a cover mounted on the base, the cover being positioned nonparallel to the axes of the plurality of acoustical flow passages to divert the air exiting the outlet from the first direction to a second direction.

5. The noise reduction hood recited in claim 4, wherein the cover is mounted perpendicular to the axes of the plurality of acoustical flow passages.

6. The noise reduction hood recited in claim 4, wherein the cover is detachable from the base.

7. The noise reduction hood recited in claim 4, wherein the cover includes at least one layer of noise reduction material disposed in a plane that is parallel to the second direction.

8. The noise reduction hood recited in claim 2, wherein the base includes a housing with a housing perimeter surrounding the air duct and an acoustical liner disposed in the housing perimeter.

9. The noise reduction hood recited in claim 8, wherein the acoustical liner has a plurality of pockets, each pocket being adapted to receive a portion of the grid to support the grid in the air duct.

10. The noise reduction hood recited in claim 2, wherein the plurality of noise reduction panels are slidably joined to each other.

11. An apparatus comprising:
   an electronic system enclosure housing at least one component of an electronic system, the enclosure having an aperture that is adapted to receive air therethrough, the enclosure including at least one cooling fan to move the air through the enclosure via the aperture in a first direction to cool the at least one component of the electronic system; and
   a noise reduction hood supported on the electronic system enclosure, the hood comprising:
      a base supported on the enclosure at the aperture, the base having an air duct that is adapted to pass the air therethrough in the first direction, and
      at least one noise reduction panel mounted on the base, the at least one noise reduction panel extending across the air duct to form a plurality of acoustical flow passages extending through the base along axes that are parallel to the first direction, the air to be passed through the acoustical flow passages to reduce acoustic noise resulting from operation of the at least one fan.

12. A noise reduction hood for an electronic system enclosure, the hood comprising:
   a base that is constructed and arranged to be supported on the enclosure, the base including an inlet and an outlet and having an air duct that is adapted to pass air therethrough in a first direction from the inlet to the outlet, the base including at least one noise reduction panel disposed in the air duct to form at least one acoustical flow passage extending between the inlet and the outlet along an axis parallel to the first direction to attenuate acoustic noise emanating from the enclosure; and
   a cover supported on the base at the outlet, the cover being positioned substantially nonparallel to the axis of the acoustical flow passage to divert the air exiting the outlet of the base from the first direction to a second direction, the cover being detachable from the base, the cover including a plurality of support posts and the base including a plurality of apertures that slidably receive the support posts therein to support the cover on the base.

13. The noise reduction hood recited in claim 12, wherein the cover includes a noise reduction panel that redirects the air to the second direction.

14. The noise reduction hood recited in claim 13, wherein the cover is perpendicular to the axis of the acoustical flow passage.

15. A noise reduction hood for an electronic system enclosure, the hood comprising:
   a base that is constructed and arranged to be supported on the enclosure, the base including an inlet and an outlet and having an air duct that is adapted to pass air therethrough in a first direction from the inlet to the outlet, the base including a plurality of noise reduction panels arranged in a grid in the air duct, the air duct being divided into a plurality of parallel acoustical flow passages extending through the base between the inlet and the outlet along an axis parallel to the first direction to attenuate acoustic noise emanating from the enclosure; and
   a cover supported on the base at the outlet, the cover being positioned substantially nonparallel to the axis of the acoustical flow passages to divert the air exiting the outlet of the base from the first direction to a second direction.

16. The noise reduction hood recited in claim 15, wherein the plurality of noise reduction panels are slidably joined to each other.

17. An apparatus comprising:
   an electronic system enclosure housing at least one component of an electronic system, the enclosure having an aperture that is adapted to receive air therethrough, the enclosure including at least one cooling fan to move the air through the enclosure via the aperture in a first direction to cool the at least one component of the electronic system; and
   a noise reduction hood supported on the enclosure, the hood including:
      a base supported on the enclosure at the aperture, the base including an inlet and an outlet and having an air duct that is adapted to pass air therethrough in a first direction from the inlet to the outlet, the base including at least one noise reduction panel disposed in the air duct to form at least one acoustical flow passage extending along an axis parallel to the first axis, the air to be passed through the air duct to reduce acoustic noise resulting from operation of the at least one fan; and
      a cover supported on the base substantially nonparallel to the axis of the acoustical flow passage to divert the air exiting the outlet from the first direction to a second direction.

18. A noise reduction hood for an electronic system enclosure, the enclosure having an aperture that is adapted to receive air therethrough, the enclosure including a raised wall surrounding the perimeter of the aperture, the raised wall having an outer perimeter, the hood comprising:
   a base that is constructed and arranged to be supported on the enclosure, the base including an inlet and an outlet and having an air duct that is adapted to pass air therethrough in a first direction from the inlet to the outlet, the base including at least one noise reduction panel in the air duct to form at least one acoustical flow passage extending between the inlet and the outlet along an axis parallel to the first direction to attenuate acoustic noise emanating from the enclosure, the base including an end wall with the inlet extending therethrough, the end wall to be disposed adjacent the raised wall of the enclosure when the base is supported on the enclosure, the end wall including an outer periphery and being substantially perpendicular to the axis of the acoustical flow passage; and
   a rim extending from substantially the entire outer periphery of the end wall approximately parallel to the axis of the acoustical flow passage, the rim being constructed and arranged to surround the outer perimeter of the raised wall of the enclosure to secure the base to the enclosure.

19. The noise reduction hood recited in claim 18, wherein the rim is expandable to conform to the portion of the enclosure.

20. The noise reduction hood recited in claim 19, wherein the rim includes a plurality of flexible flanges.

21. The noise reduction hood recited in claim 20, wherein the flanges are constructed and arranged to flex independent of each other.

22. The noise reduction hood recited in claim 18, wherein the at least one noise reduction panel includes a plurality of noise reduction panels arranged in a grid, the air duct being divided into a plurality of parallel acoustical flow passages through the base.

23. The noise reduction hood recited in claim 22, wherein the plurality of noise reduction panels are slidably joined to each other.

24. The noise reduction hood recited in claim 18, further comprising a cover mounted on the base nonparallel to the axis of the acoustical flow passage to divert the air exiting the outlet from the first direction to a second direction.

25. The noise reduction hood recited in claim 24, wherein the cover is detachable from the base.

26. An apparatus comprising:
   an electronic system enclosure housing at least one component of an electronic system, the enclosure having an aperture that is adapted to receive air therethrough, the enclosure including at least one cooling fan to move the air through the enclosure via the aperture in a first direction to cool the at least one component of the electronic system; and
   a noise reduction hood supported on the enclosure, the hood including:
      a base supported on the enclosure at the aperture, the base having an air duct that is adapted to pass the air therethrough in the first direction, the base including at least one noise reduction panel in the air duct to form at least one acoustical flow passage extending along an axis parallel to the first axis, the air to be passed through the air duct to reduce acoustic noise resulting from operation of the at least one fan; and
      a rim extending from the base approximately parallel to the axis of the acoustical flow passage, the rim including a plurality of flexible flanges surrounding a portion of the enclosure to secure the base to the enclosure.

27. A noise reduction hood for an electronic system enclosure, the enclosure having an aperture that is adapted to receive air therethrough, the hood comprising:
   a base that is constructed and arranged to be supported on the enclosure, the base including a first end wall with an inlet, a second end wall with an outlet and a side wall connecting the first and second end walls, the base having an air duct that is adapted to pass air therethrough in a first direction substantially perpendicular to the first and second end walls from the inlet to the outlet, the inlet adapted to be positioned adjacent the aperture when the base is supported on the enclosure, each of the inlet and the outlet having a cross-sectional area, the cross-sectional area of the inlet being substantially equal to the cross-sectional area of the outlet; and
   at least one noise reduction panel mounted on the base between the first and second end walls, the at least one noise reduction panel extending across the air duct between the inlet and the outlet to form a plurality of acoustical flow passages extending through the base along axes that are parallel to the first direction, the air is to be passed through the acoustical flow passages to attenuate acoustic noise emanating from the enclosure.

28. The noise reduction hood recited in claim 27, wherein the at least one noise reduction panel includes a grid of noise reduction panels.

29. The noise reduction hood recited in claim 28, wherein the plurality of acoustical flow passages is arranged in a two-dimensional array.

30. The noise reduction hood recited in claim 28, wherein the base includes a housing with a housing perimeter surrounding the air duct and an acoustical liner disposed in the housing perimeter.

31. The noise reduction hood recited in claim 30, wherein the acoustical liner has a plurality of pockets, each pocket being adapted to receive a portion of the grid to support the grid in the air duct.

32. The noise reduction hood recited in claim 28, wherein the plurality of noise reduction panels are slidably joined to each other.

33. The noise reduction hood recited in claim 27, further comprising a cover mounted on the base, the cover being positioned nonparallel to the axes of the plurality of acoustical flow passages to divert the air from the first direction to a second direction.

34. The noise reduction hood recited in claim 33, wherein the second direction is perpendicular to the first direction.

35. The noise reduction hood recited in claim 33, wherein the cover is detachable from the base.

36. The noise reduction hood recited in claim 33, wherein the cover includes at least one layer of noise reduction material disposed in a plane that is parallel to the second direction.

* * * * *